(12) United States Patent
Bajwa et al.

(10) Patent No.: US 7,088,627 B1
(45) Date of Patent: Aug. 8, 2006

(54) COLUMN REDUNDANCY SCHEME FOR NON-VOLATILE FLASH MEMORY USING JTAG INPUT PROTOCOL

(75) Inventors: Asim A. Bajwa, San Jose, CA (US); Ping-Chen Liu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 349 days.

(21) Appl. No.: 10/629,365

(22) Filed: Jul. 29, 2003

(51) Int. Cl.
*G11C 7/00* (2006.01)

(52) U.S. Cl. ............... 365/200; 365/201; 365/189.02; 365/189.12; 365/189.05

(58) Field of Classification Search ............... 365/200, 365/201, 189.02, 189.12, 189.05
See application file for complete search history.

(56) References Cited

U.S. PATENT DOCUMENTS

| | | | |
|---|---|---|---|
| 6,462,998 B1 * | 10/2002 | Proebsting | 365/201 |
| 6,795,360 B1 * | 6/2003 | Au et al. | 365/221 |
| 6,665,222 B1 * | 12/2003 | Wright et al. | 365/203 |
| 6,816,420 B1 | 11/2004 | Liu et al. | |

OTHER PUBLICATIONS

Institute of Electrical and Electronics Engineering, Inc., "IEEE Standard Test Access Port and Boundary-Scan Architecture" IEEE Std 1149.1-1990 (Includes IEEE Std 1149. 1a-1993), Oct. 21, 1993, pp. 1-172, ISBN 1-55937-350-4, available from Institute of Electrical and Electronics Engineering, Inc., 345 East 47th Street, New York, NY 10017-2394.

\* cited by examiner

*Primary Examiner*—Tuan T. Nguyen
(74) *Attorney, Agent, or Firm*—John Kubodera; Justin Liu (57) ABSTRACT

A JTAG-programmable IC includes a memory array having redundant columns, a partial-width data register, and a full-width bitline register. A programming bitstream is shifted into the data register in discrete portions, with each portion being loaded into the bitline latch before the next portion is shifted into the data register. The programming bitstream portions fill the bitline latch sequentially unless a count indicator for a particular portion matches a predetermined defective column value, in which case that bitstream portion is rerouted to a region of the bitline latch associated with the redundant columns of the memory array. The count indicator is incremented with each new bitstream portion shifted into the data register. Once the programming bitstream is fully loaded into the bitline latch, the data is programmed into a selected row of the memory array in page mode.

21 Claims, 9 Drawing Sheets

COLUMN REDUNDANCY SCHEME FOR NON-VOLATILE FLASH MEMORY USING JTAG INPUT PROTOCOL

FIELD OF THE INVENTION

The present invention relates to the field of serially programmable devices, and in particular to a Joint Test Action Group (JTAG) programmable device incorporating column redundancy.

BACKGROUND OF THE INVENTION

Figure 1:
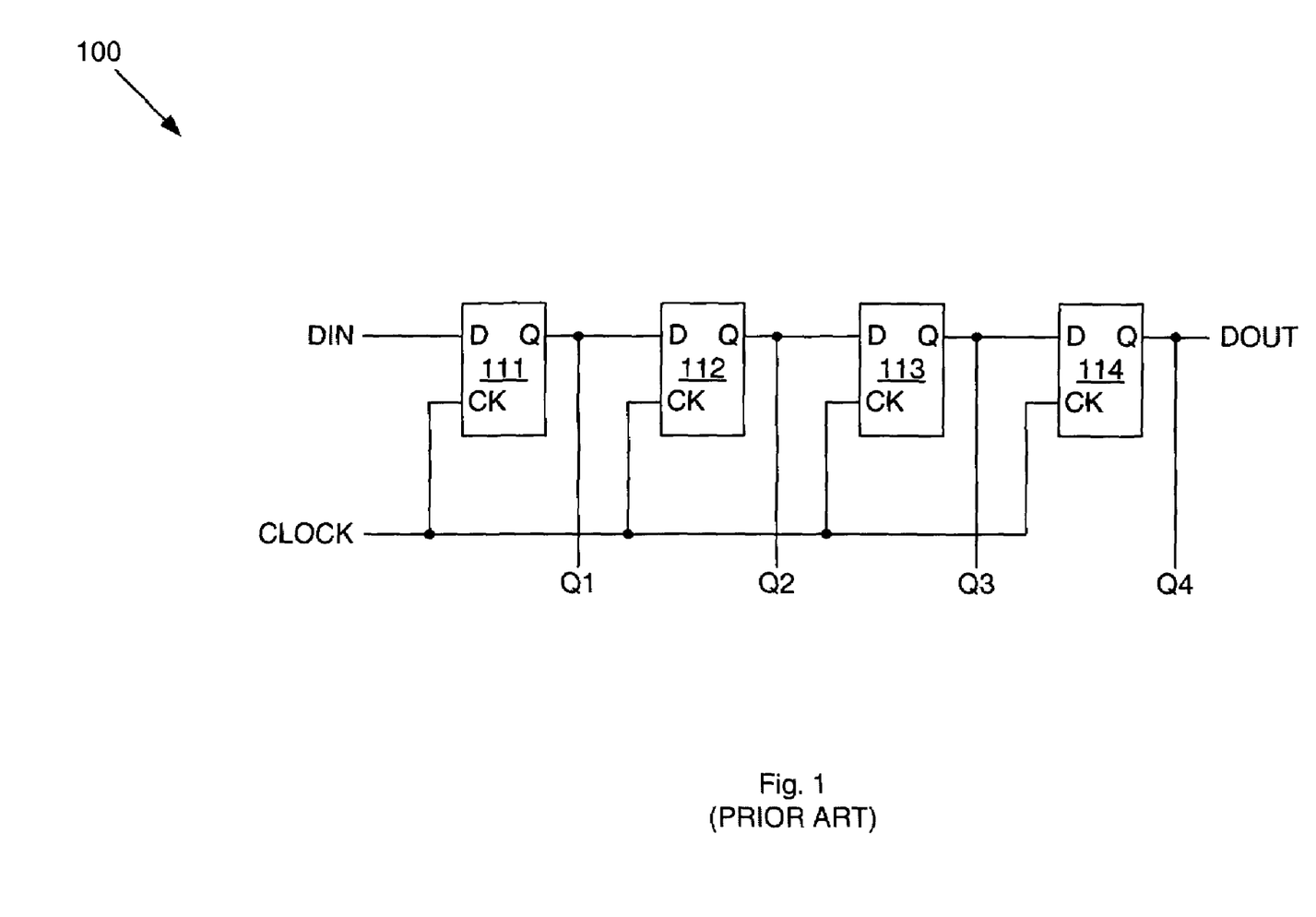
FIG. 1 is a schematic diagram of a conventional cascaded shift register.

To reduce pin count in an integrated circuit (IC), serial programming is often used. Because serial programming data is loaded into the IC in a continuous stream, only a single data input pin is required for programming. Typically, the programming data is loaded into a shift register within the IC. FIG. 1 shows a cascaded shift register 100 that has a typical register structure for a serially programmable IC. Shift register 100 includes flip flops 111, 112, 113, and 114, each of which includes an input terminal D, an output terminal Q, and a clock terminal CK. Output terminal Q of flip flop 111 is connected to input terminal D of flip flop 112, output terminal Q of flip flop 112 is connected to input terminal D of flip flop 113, and output terminal Q of flip flop 113 is connected to input terminal D of flip flop 114 to form the cascaded structure. Meanwhile, each clock terminal CK of flip-flops 111–114 is coupled to receive a clock signal CLOCK.

On each pulse of clock signal CLOCK, an input data value DIN is loaded into flip flop 111, the data previously stored in flip flop 111 is loaded into flip flop 112, the data previously stored in flip flop 112 is loaded into flip flop 113, and the data previously stored in flip flop 113 is loaded into flip flop 114. The data previously stored in flip-flop 114 is provided as an output data value DOUT. In this manner, serial data is shifted into (and out of) shift register 100. The data stored in shift register 100 can also be read out in parallel from the output terminal Qs of each of flip flops 111–114, as data values Q1–Q4, respectively.

Serially programmed memory ICs use this serial-in-parallel-out (SIPO) capability of a cascaded shift register to improve programming efficiency. In a typical memory IC, programming an individual memory cell in a memory array takes much longer than shifting data into a shift register. This is especially true for non-volatile memories such as electrically erasable programmable read only memories (EEPROMs) and FLASH memories. For example, 14 milliseconds (ms) might be required to program a memory cell in an EEPROM or FLASH memory. In contrast, filling a shift register with new data only requires a number of clock cycles equal to the number of flip flops in the shift register—e.g., if the system clock is running at 22 MHz and the shift register is a 4096-bit shift register, filling the shift register would only require 0.19 ms ($=4096/22 \times 10^6$). Therefore, to minimize programming time, serial data is shifted into the shift register, and the contents of the shift register are then programmed into a particular address of the memory array as a single word. Since the memory cell programming for an entire row of the memory array can be performed in parallel, this "page mode" programming technique can significantly reduce overall programming time.

Figure 2A:
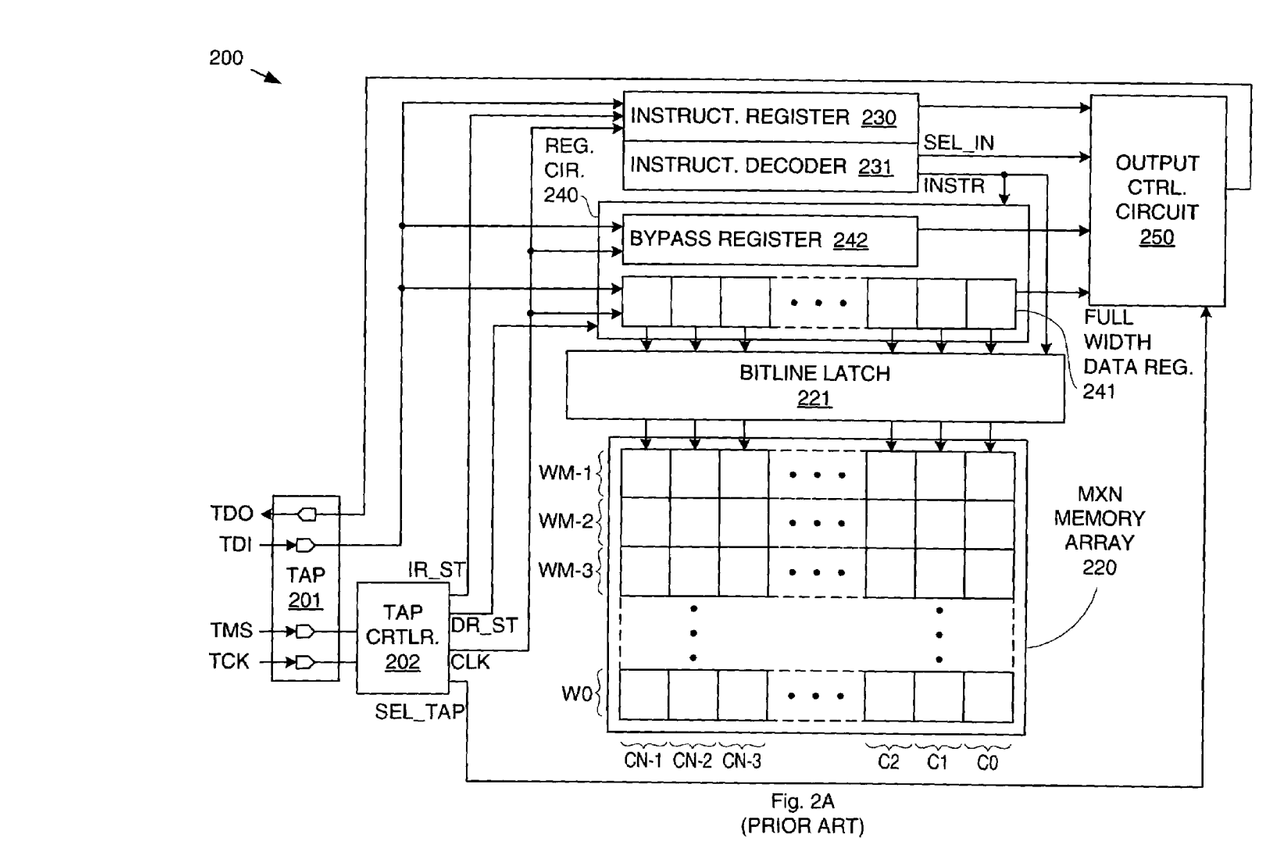
FIG. 2A is a schematic diagram of a conventional serially programmable, JTAG-compliant IC.

FIG. 2A shows a serially programmable memory IC 200 that is programmable via a JTAG (Joint Test Action Group) interface. JTAG refers to IEEE standard 1149.1-1990 (includes IEEE Std 1149.1a-1993), published by the Institute of Electrical and Electronics Engineers, Inc. on Oct. 21, 1993 under ISBN 1-55937-350-4, herein incorporated by reference. IEEE standard 1149.1 defines a boundary scan test method for detecting bad connections (shorted pins, open pins, bad traces, etc.) in circuit boards. IC 200 includes a test access port (TAP port) 201, a TAP controller 202, an M×N memory array 220, a bitline latch 221, an instruction register 230, an instruction decoder 231, a register circuit 240, and an output control circuit 250. Register circuit 240 includes a "full width" (i.e., the same width as memory array 220) data register 241 and a bypass register 242.

All JTAG compliant devices such as IC 200 include test access port (TAP port) 201 and TAP controller 202 to provide the desired boundary scan functionality. TAP port 201 includes three input connections for receiving a test data input signal TDI, a test mode select signal TMS, and a test clock signal TCK. The TAP port also includes an output connection through which a test data output signal TDO is transmitted. A TAP port sometimes includes an optional reset pin to reset the test logic.

TAP port 201 provides signals TMS and TCK to tap controller 202, while providing signal TDI to instruction register 230 and register circuit 240. TAP controller 202 is a state machine controlled by signal TMS that runs the JTAG hardware through two paths—an instruction register path ("IR path") during which data from signal TDI is loaded into instruction register 201, and a data register path ("DR path") during which data from signal TDI is loaded into register circuit 240. A clock signal CLK provided by TAP controller 202 (based on test clock signal TCK) clocks the data into the appropriate data or instruction registers. Instruction decoder 231 converts the data stored in instruction register 230 into an instruction INSTR that specifies the type of test or action to be performed using the data stored in register circuit 240. Data can be shifted into data register 241 or can be "passed through" IC 200 via bypass register 242. Output control circuit 250 provides test data output signal TDO at TAP port 201 from one of instruction register 230, data register 241, or bypass register 242, depending on control signals SEL_IN and SEL_TAP from instruction decoder 231 and TAP controller 202, respectively.

The behavior of TAP controller 201 in response to test mode select signal TMS is described in detail in section 5 of IEEE standard 1149.1. Basically, as signal TMS is switched between logic HIGH and LOW levels, TAP controller 201 is transitioned between its various states in response to clock signal TCK. These states determine how data at TAP controller 201 and in instruction register 230 and register circuit 240 are handled. When TAP controller 201 is operating in the IR path, the value of an instruction register state IR_ST manages the loading of data into (and out of) instruction register 230, and when TAP controller 201 is operating in the DR path, the value of a data control state DR_ST manages the loading of data into (and out of) the registers of register circuit 240.

Although the IEEE standard 1149.1 was originally developed for testing purposes, the standardized JTAG interface has become popular as a programming interface because of its ready availability on many ICs. "JTAG-programmable" ICs are serially programmed through the TDI input connection of TAP controller 201. M×N memory array 220 is made up of M rows (i.e., rows WM−1 through W0) and N columns (i.e., columns CN−1 through C0) of memory cells. Program data is shifted into data register 241, and this data is latched into bitline latch 221 and then programmed into memory array 220 in a parallel programming operation (page mode). Since data register 241 has the same width as memory array 220, each programming operation fills a full row of memory array 220. In this manner, the TAP port can also be used for programming purposes, thereby minimizing the number of pins required for an IC.

However, as memory arrays continue to increase in size, the denser memory structures become more susceptible to memory defects (such as a column short, bad interconnect, etc.). Therefore, to maintain a high production yield, it becomes increasingly desirable to provide redundancy in a memory array—i.e., include extra columns that can be used to replace defective columns. In the absence of such redundancy, a single bad memory cell can render an entire memory array unusable. Conventionally addressed memory arrays incorporate such redundant columns by simply addressing the appropriate redundant column instead of the defective column. However, in conventional serially programmable memory arrays, this type of random access is not available, making redundancy extremely difficult to incorporate.

For example, in FIG. 2A, columns C1 and C0 could be redundant columns to be used if there are defects in any of columns CN−1 through C2 (which would then represent the "primary memory region" of memory array 220—i.e., the portion of memory array 220 in which data would be stored in the absence of array defects). In such an arrangement, replacing a defective column with column C0 would require that the flip flop in data register 241 associated with column C0 receive the data originally intended for the flip flop associated with the defective column. However, the flip-flops in a shift register (i.e., data register 241) are hardwired in a predetermined order, and so cannot be easily reordered to incorporate the redundant column in place of the defective column.

To overcome this limitation, conventional ICs sometimes include redundancy logic that counts clock cycles as data is shifted into the shift register. The redundancy logic uses the clock counts to determine whether a particular data bit is associated with a defective column, and if so, transfers that data bit to a redundant column. To function properly, this type of redundancy logic must know exactly when the program data begins shifting into the data register. However, in many cases, such program data timing knowledge is not available, so conventional redundancy logic cannot be used.

Figure 2B:
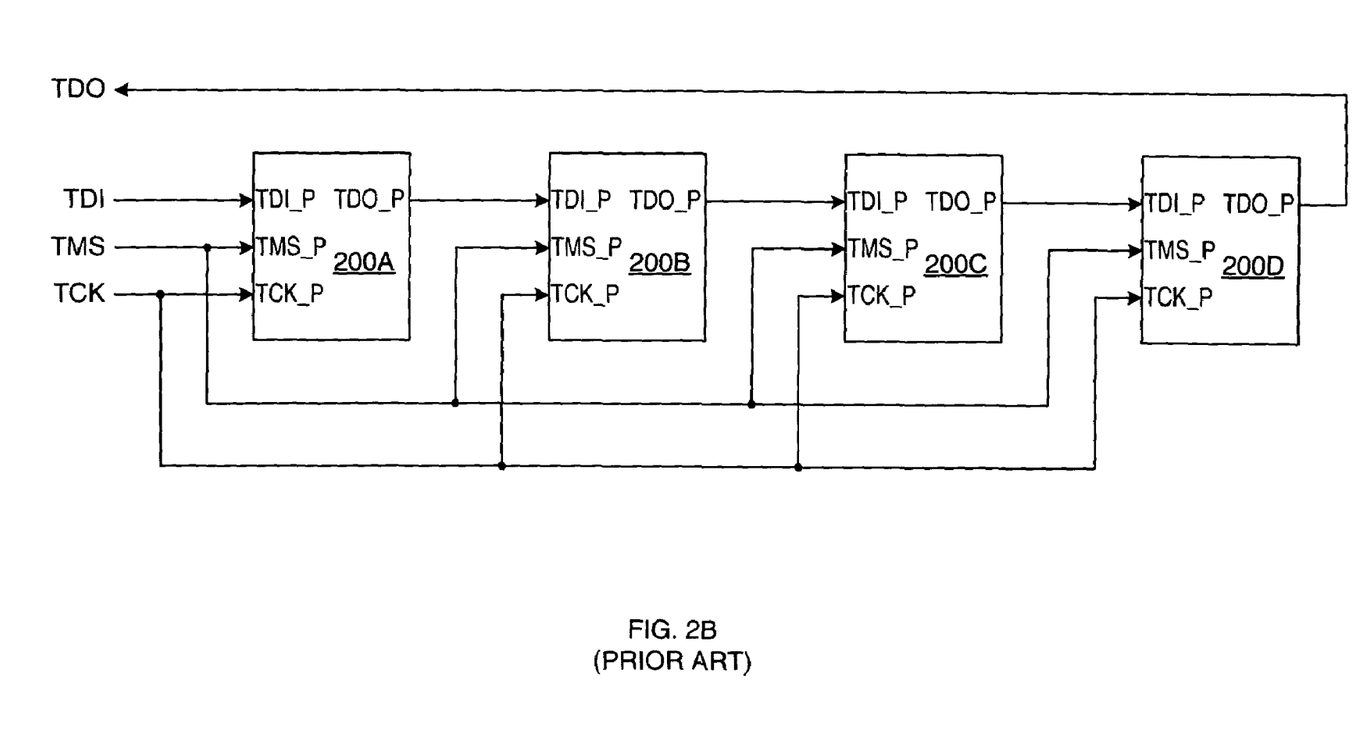
FIG. 2B is a block diagram of conventional JTAG-compliant ICs in a daisy-chain configuration.

For example, multiple JTAG-compliant ICs are typically connected into a continuous chain so that the boundary scan operation can be performed. FIG. 2B shows a chain of JTAG-compliant ICs 200A, 200B, 200C, and 200D. Each of ICs 200A–200D includes a data input pin TDI_P, a data output pin TDO_P, a mode select pin TMS_P, and a clock pin TCK_P (as described with respect to FIG. 2A). The mode select pins TMS_P of ICs 200A–200D are commonly coupled to receive mode select signal TMS, while the clock pins TCK_P of ICs 200A–200D are commonly coupled to receive clock signal TCK. In contrast, the data pins (TDI_P and TDO_P) of ICs 200A–200D are serially connected— i.e., pin TDO_P of IC 200A is connected to pin TDI_P of IC 200B, pin TDO_P of IC 200B is connected to pin TDI_P of IC 200C, and pin TDO_P of IC 200C is connected to pin TDI_P of IC 200D. Therefore, data from signal TDI can be shifted sequentially into the data registers of ICs 200A–200D (and data from those registers can be shifted out as signal TDO). This serial arrangement beneficially allows a continuous stream of test data to be shifted through ICs 200A–200D to perform boundary scan operations.

Figure 2C:
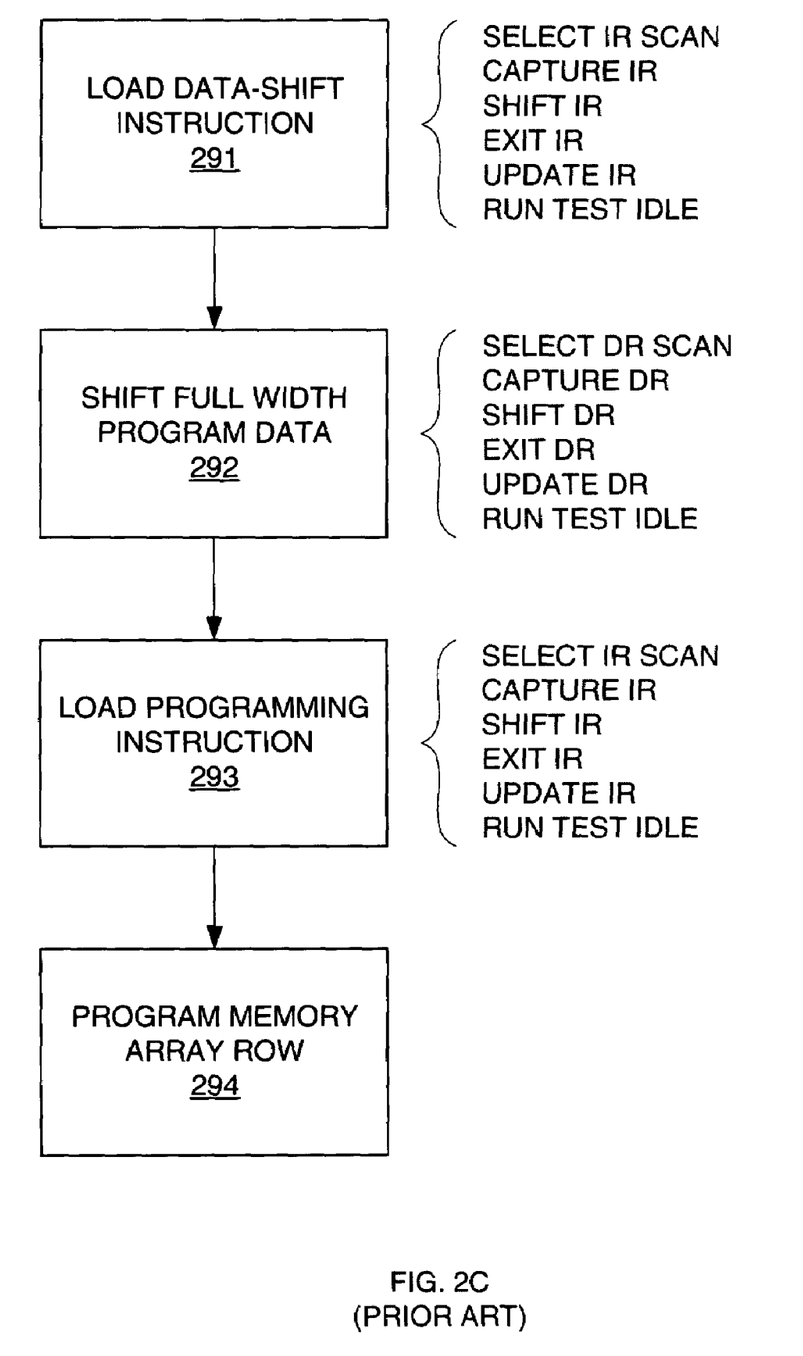
FIG. 2C is a flow diagram of a conventional serial programming methodology using a JTAG interface.

A conventional programming flow for ICs 200A–200D is shown in FIG. 2C. In a "LOAD DATA-SHIFT INSTRUCTION" step 291, an instruction that enables shifting data to be programmed into the devices, is loaded into the instruction registers of ICs 200A–200D in a continuous bitstream. The standard TAP controller states in the associated IR path are listed next to step 291 for reference purposes. Then, in a "SHIFT FULL WIDTH PROGRAM DATA" step 292, the program data for page mode programming of each of ICs 200A–200D is loaded into the ICs in a continuous bitstream. Once again, the standard TAP controller states in the associated DR path are listed next to step 292 for reference purposes. Finally, in a "LOAD PROGRAMMING INSTRUCTION" step 293, an instruction is loaded into the instruction registers of ICs 200A–200D in a continuous bitstream (the TAP controller states in the associated IR path are listed next to step 293 for reference). This initiates a "PROGRAM MEMORY ARRAY ROW" step 294 in each of the 4 ICs. During step 294 a selected row in each of the memory arrays of ICs 200A–200D is programmed from the data register of the IC. In this manner, the JTAG interface can be used to program ICs 200A–200D. However, because conventional JTAG-based programming methods involve shifting the programming data through the chain of ICs in a single continuous stream, none of the individual ICs has knowledge of when its own program data is being loaded into its shift register. Only when program data has filled the entire chain of ICs can an individual IC "know" its specific program data. Therefore, conventional redundancy logic cannot be used in JTAG-compliant ICs.

Accordingly, it is desirable to provide a system and method for incorporating redundancy into a JTAG-programmable IC without requiring specific knowledge about the timing of program data.

SUMMARY OF THE INVENTION

The invention enables the use of memory array redundancy in a JTAG-programmable IC by programming the memory array in a segmented manner, and using JTAG-compliant instructions to provide localized tracking of the program data. The JTAG-compliant instructions provide appropriate information about the beginning and end of the program data stream, and the localized tracking allows the program data intended for defective columns in the memory array to be stored instead in redundant columns, thereby maintaining data integrity.

According to an embodiment of the invention, a JTAG-programmable IC includes a memory array having a set of redundant columns, an instruction register, a partial width data register that has a width that is a divisor of both the width of the entire memory array and the redundant columns, and an in-system programming (ISP) circuit that controls the loading of data from the data register into the memory array. To program the memory array, a segmented programming instruction is loaded into the instruction register. The segmented programming instruction is a JTAG-compliant instruction that causes a programming bitstream to be processed in discrete segments (portions) before being programmed into the memory array as a complete word.

In a segmented programming operation, a first portion of a programming bitstream is shifted into the partial width data register, and this first portion is loaded into a first portion of a bitline latch in the ISP circuit. The bitline latch has the same width as the memory array so that an entire word can be programmed in parallel (page mode). A second portion of the programming bitstream is then shifted into the data register, and this second portion is loaded into a second portion of the bitline latch. This segmented bitstream loading operation continues until the entire programming bitstream has been loaded into the bitline latch, at which point the contents of the bitline latch are programmed into a desired row of the memory array.

By breaking the programming bitstream into multiple bitstream portions, the invention differentiates the programming bitstream for the memory array from other TDI inputs in a JTAG scan chain. The segmented programming flow imposed by the partial width data register requires that the bounds of the programming bitstream be explicitly defined so that the bitstream portions can be properly assembled into the full (page mode) programming bitstream at the memory array. This knowledge about the start of the programming bitstream allows the ISP circuit to assign a counter value (counter signal) to each bitstream portion that is shifted into the data register. The counter value is incremented for each new bitstream portion, and therefore indicates the position of the bitstream portion within the full programming bitstream.

This assignment of counter values is what allows the benefits of the memory array redundancy to be realized. The counter value of a bitstream portion corresponds to a grouping of latches from the bitline latch in which the bitstream portion is to be stored. That latch grouping is in turn associated with a specific column grouping (i.e., grouping of adjacent columns) in the memory array. Therefore, each counter value corresponds to a unique column grouping in the memory array. If the column grouping associated with a particular counter value includes defective columns, the bitstream portion assigned that counter value is "rerouted" by the ISP circuit to a latch grouping of the bitline latch associated with a redundant column grouping, thereby maintaining data integrity. According to an embodiment of the invention, the redundant portion of the memory array can include multiple groupings of redundant columns having the same width as the data register, thereby increasing the redundancy of the memory array.

According to an embodiment of the invention, the ISP circuit stores those counter values that correspond to column groupings in the memory array that include defective columns. These "defect addresses" can be compared to the counter values assigned to bitstream portions, so that the appropriate bitstream portions can be shunted to the redundant columns during the segmented programming operation.

The present invention will be more fully understood in view of the following description and drawings.

DETAILED DESCRIPTION OF THE DRAWINGS

Figure 3A:
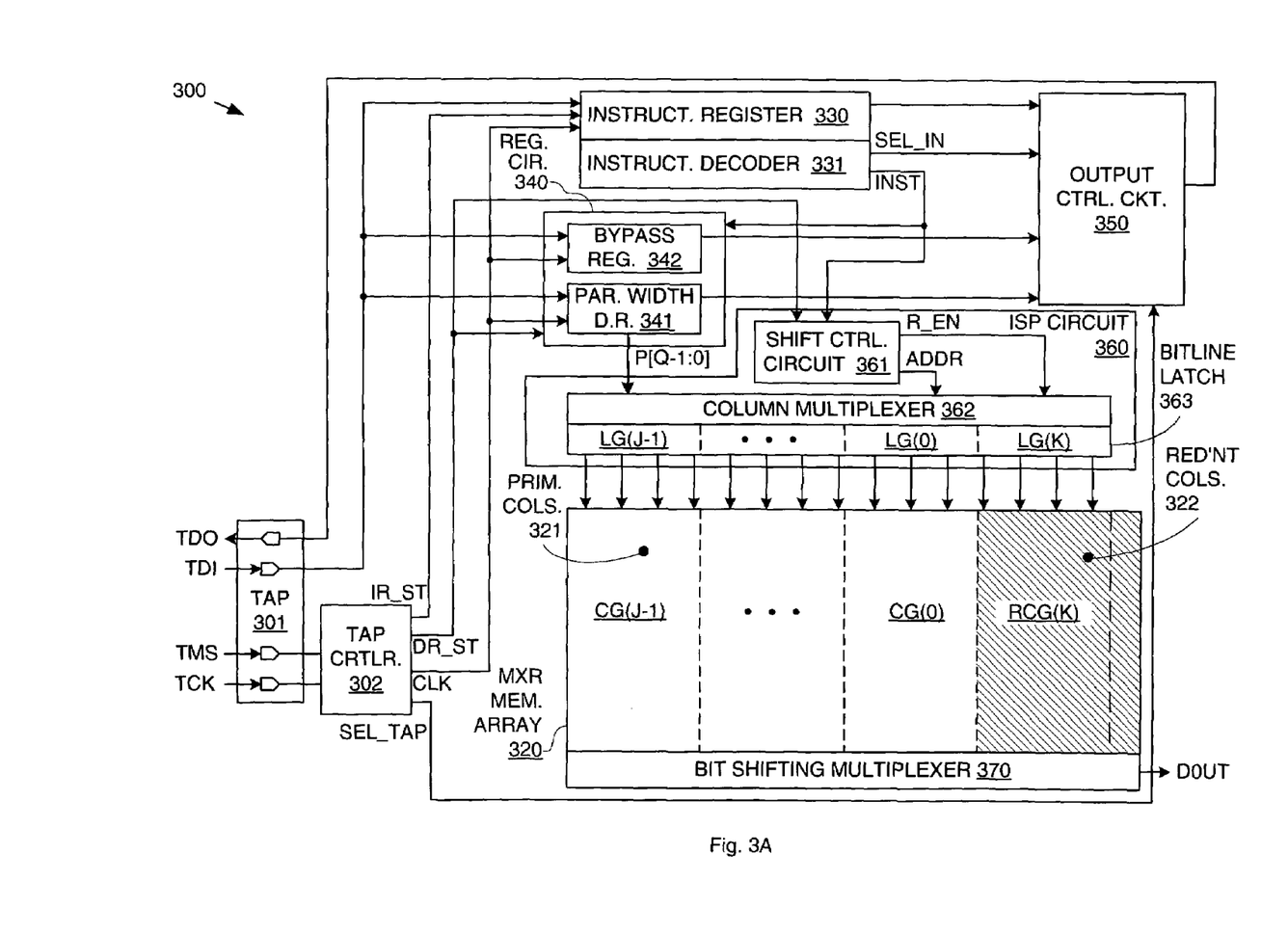
FIG. 3A is a schematic diagram of a serially programmable, JTAG-compliant IC incorporating memory array redundancy, according to an embodiment of the invention.

By segmenting a programming bitstream for an IC in predetermined portions, the present invention beneficially enables the use of redundancy in a JTAG-programmable IC or daisy-chained JTAG-programmable ICs. The invention incorporates a JTAG command loop to sequentially load the portions of the programming bitstream, and at the same time keep track of the individual bitstream portions so that a portion(s) associated with a defective memory array column can be assigned instead to a grouping of redundant columns in the memory array. FIG. 3A shows a JTAG-programmable IC 300 that can perform this segmented programming operation in accordance with an embodiment of the invention. IC 300 can comprise any type of JTAG-programmable IC, such as an electrically erasable programmable read only memory (EEPROM) or a FLASH memory.

IC 300 includes a TAP port 301, a TAP controller 302, a memory array 320, an instruction register 330, an instruction decoder 331, a register circuit 340, an in-system programming (ISP) circuit 360, a bit shifting multiplexer 370, and an output control circuit 350. Register circuit 340 includes a "partial width" (i.e., less than the width of memory array 320) data register 341 and a bypass register 342. Just as described with respect to FIG. 2A, TAP port 301 and TAP controller 302 are standard JTAG interface components. TAP port includes three input connectors for receiving signals TDI, TMS, and TCK (these input connectors are sometimes referred to as TDI, TMS, and TCK terminals, respectively), and an output connector for providing signal TDO (this output connector is sometimes referred to as a TDO terminal). TAP port 301 provides signals TMS and TCK to tap controller 302, and provides signal TDI and a local clock signal CLK (typically equivalent to test clock signal TCK) to instruction register 330 and register circuit 340. TAP controller 302 is a state machine controlled by signal TMS that runs the JTAG hardware the standard IR and DR paths.

When TAP controller 302 is operating in the IR path, instruction data is shifted into instruction register 330 from signal TDI, and instruction decoder 331 converts the stored data 330 into an instruction INST that specifies the type of test or action to be performed on test data by register circuit 340 when TAP controller 302 switches into the DR path. Test data from signal TDI can be shifted into data register 341 or can be "passed through" IC 300 via bypass register 342, in either case being clocked by local clock signal CLK. Output control circuit 350 provides test data output signal TDO at TAP port 301 from one of instruction register 330, data register 341, or bypass register 342, depending on control signals SEL_IN and SEL_TAP from instruction decoder 331 and TAP controller 302, respectively.

During JTAG operations, IC 300 provides the same functionality as conventional IC 200 shown in FIG. 2A, with test data input signal TDI and test data output signal TDO being shifted into and out of, respectively, data register 341. When TAP controller 302 is operating in the IR path, the value of an IR state IR_ST manages the loading of data into (and out of) instruction register 330. When TAP controller 302 is operating in the DR path, the value of a DR state DR_ST manages the loading of data into (and out of) the registers of register circuit 340, based on the specific instruction INST provided by instruction decoder 331.

To provide redundancy in IC 300, memory array 320 includes both primary columns 321 and redundant columns 322. The incorporation of partial width data register 341 allows IC 300 to make use of redundant columns 321 in memory array 320, thereby improving yield for IC 300. Partial width data register 341 has a width that is a divisor of the width of memory array 320 (and of the width of the primary columns and the redundant columns). Therefore, memory array 320 can be organized into "column groupings" CG(0)–CG(J–1) and RCG(K), with each column grouping having the same width as partial width data register 341. Column groupings CG(0)–CG(J–1) represent columns within the primary memory region of memory array 320 (i.e., "primary column groupings"), while column grouping RCG(K) represents columns from redundant columns 322 (i.e., a "redundant column grouping").

Note that memory array 320 can have any width, so long as the width of data register 341 is a divisor of the array width. For example, memory array 320 may have a primary memory region width of 4096 bits, along with 16 redundant columns. Partial width data register 341 may then have a width of 16 bits, in which case the primary memory region of memory array 320 may be divided into 256 column groupings (i.e., column groupings CG(0)–CG(255)) and the 16 redundant columns would be a single redundant column grouping (i.e., column grouping RCG(256)).

Note further that while the operation of IC 300 will be described with respect to a single redundant column grouping, an IC in accordance with the invention can include any number of redundant column groupings, as indicated by the dashed line in redundant columns 322. Any data that is originally associated with a column grouping that has been identified as containing defects are rerouted to a redundant column grouping to ensure that the data is properly stored.

The rerouting of data to redundant columns 322 is incorporated into a segmented programming methodology in which a programming bitstream for memory array 320 is processed as a series of bitstream portions, wherein each of the bitstream portions is the width of data register 341. According to an embodiment of the invention, ISP circuit 360 can include a shift control circuit 361, a column multiplexer 362, and a bitline latch 363 to provide this capability. To perform a programming operation, a segmented programming instruction is loaded into instruction register 330, and instruction decoder 331 provides the appropriate instruction INST to shift control circuit 361. Then, as TAP controller 302 transitions DR state DR_ST between the various DR chain states, data is shifted into data register 341 and then loaded into bitline latch 363 by column multiplexer 362. Bitline latch 363 has the same width as memory array 320, and can therefore be organized into latch groupings LG(0)–LG(J–1) and LG(K), corresponding to primary column groupings CG(0)–CG(J–1) and redundant column grouping RCG(K), respectively, of memory array 320. When the entire programming bitstream has been processed through data register 341, bitstream latch 363 programs its stored data into a selected row of memory array 320 (i.e., page mode programming).

During a segmented programming operation, each time data register 341 is filled with a new bitstream portion P[Q–1:0], shift control circuit 361 generates a local address ADDR (i.e., a bitline position indicator) that specifies the region within bitline latch 363 into which the bitstream portion is to be loaded by column multiplexer 362. Local address ADDR is based on a counter value that increments with each new bitstream portion that is shifted into data register 341, so in the absence of the detection of a defective column, bitstream latch regions LG(0)–LG(J–1) (i.e., the bitstream latch regions corresponding to the primary memory region of memory array 320) are filled sequentially by the incoming bitstream portions. Note that latch regions LG(0)–LG(J–1) are arranged in a right to left pattern, so that the stored data bits retain the same order as the bits the programming bitstream (if the redundant columns are not used).

To provide rerouting of data to redundant column grouping RCG(K), shift control circuit 361 compares the counter value for each local address ADDR with a predetermined counter value ("defect address") that corresponds to a column grouping that includes a memory defect (prior testing of memory array 320 provides the defect address(es)). When a match is detected, shift control circuit 361 asserts a redundancy enable signal R_EN that overrides local address ADDR and causes the instant bitstream portion P[Q–1:0] to be loaded into region LG(K) of bitline latch 363. Thus, when the data in bitline latch 363 is programmed into memory array 320, this bitstream portion is programmed into redundant columns 322. In this manner, redundancy is provided in a JTAG-programmable IC.

In a similar manner, to read a page out of memory array 320, control logic in bit shifting multiplexer 370 generates the same sequence of local addresses (counter-based) as generated by ISP circuit 360 to read out the data from primary column groupings CG(0) through CG(J–1) in memory array 320, comparing the local address with the defect address for each column grouping. If a match is detected, data is read from redundant column grouping RCG(K) instead of the primary column grouping associated with the particular local address.

Figure 3B:
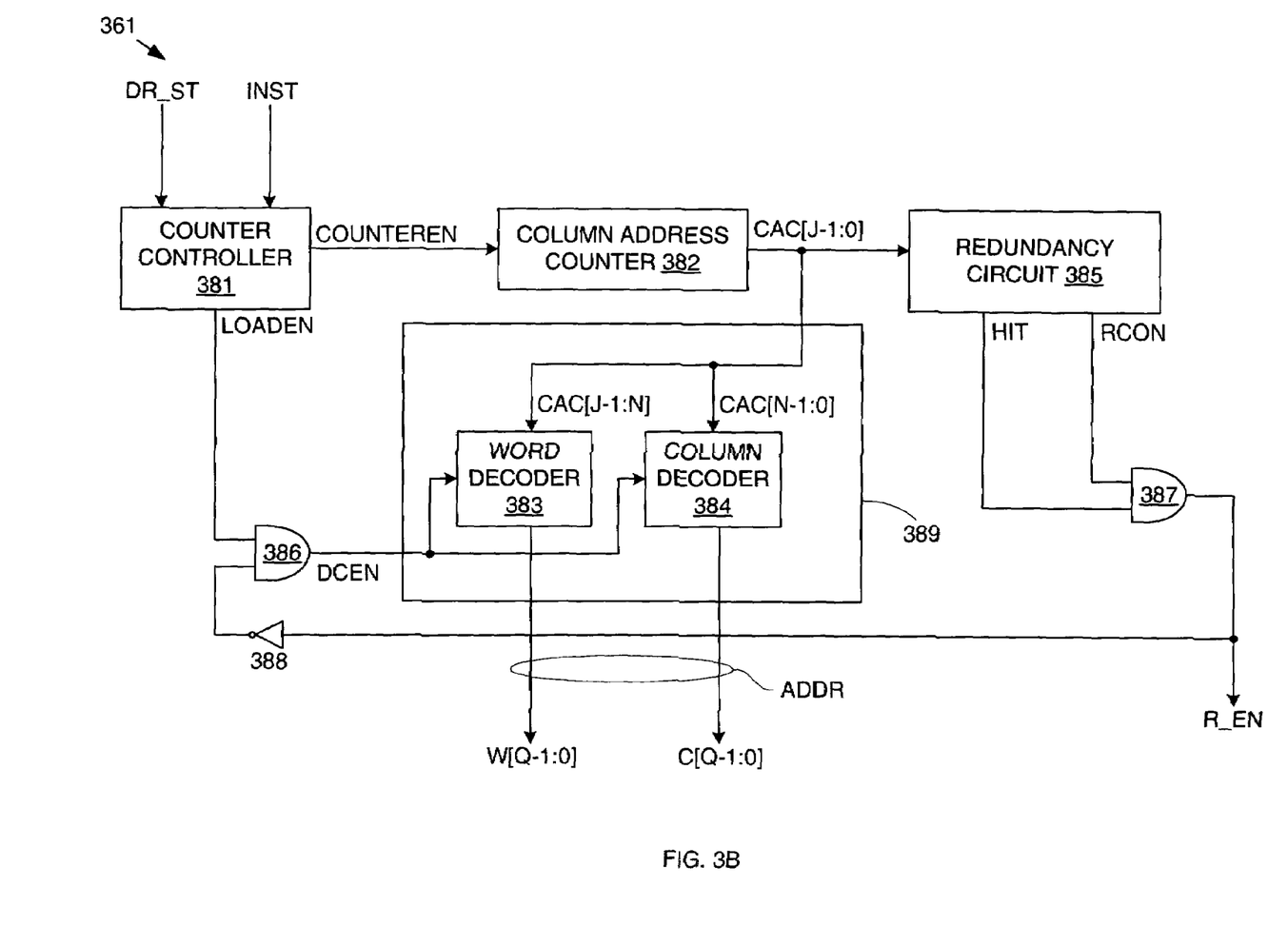
FIG. 3B is a schematic diagram of a shift control circuit for the serially programmable IC of FIG. 3A, according to an embodiment of the invention.

FIG. 3B shows a schematic diagram of shift control circuit 361 (shown in FIG. 3A) in accordance with an embodiment of the invention. Shift control circuit 361 includes a counter controller 381, a J-bit column address counter 382, an address decoder 389, a redundancy circuit 385, AND gates 386 and 387, and an inverter 388. Column address counter 382 provides a counter value CAC[J-1:0] to redundancy circuit 385. If counter value CAC[J-1:0] corresponds to a column grouping that includes defective columns (i.e., if counter value CAC[J-1:0] represents a defective column grouping address), redundancy circuit 385 asserts a match signal HIT. Otherwise redundancy circuit 385 maintains match signal HIT at a logic LOW state. According to an embodiment of the invention, to make this determination, redundancy circuit 385 can include a non-volatile content addressable memory (CAM) that stores the counter values corresponding to defective column groupings.

Match signal HIT and a redundant column usage on signal RCON (also from redundancy circuit 385) are provided to the input terminals of AND gate 387. Redundant column usage on signal RCON indicates when redundant columns are in use (i.e., redundancy is enabled for IC 300), and when asserted, allows match signal HIT to control the output of AND gate 387, and when deasserted, holds the output of AND gate 387 at a logic LOW state. Therefore, redundant column usage on signal RCON effectively enables or disables the redundancy control provided by match signal HIT. Note that according to another embodiment of the invention, AND gate 387 is eliminated (along with redundant column usage on signal RCON), thereby allowing match signal HIT to always be enabled.

If redundant column usage on signal RCON is asserted and a defective column grouping address is detected by redundancy circuit 385, the resulting assertion of match signal HIT places the output of AND gate 387 in a logic HIGH state, thereby asserting a redundancy enable signal R_EN. Inverter 388 inverts redundancy enable signal R_EN and provides this inverted value to an input terminal of AND gate 386. Counter controller 381 is coupled to receive DR state DR_ST values from TAP controller 302 (not shown) and instruction INST from instruction decoder 331 (not shown). When DR state DR_ST transitions from a SHIFT-DR state to an EXIT1-DR state (indicating that the shifting of data into data register 341 is complete), counter controller 381 asserts a load enable signal LOADEN at the other input terminal of AND gate 386.

Because redundancy circuit 385 has detected a defective column grouping address, match signal HIT is asserted, so that inverter 388 provides a logic LOW signal to AND gate 386. This in turn causes decode enable signal DCEN to be deasserted, thereby disabling address decoder 389. Meanwhile, redundancy enable signal R_EN causes column multiplexer 362 (described below) to load the instant bitstream portion into the region of bitline latch associated with the redundant columns.

However, if redundancy circuit 385 does not detect a defective column grouping address (i.e., match signal HIT is maintained at a logic LOW state), when load enable signal LOADEN is asserted, AND gate 386 asserts a decode enable signal DCEN that enables address decoder 389, which then decodes counter value CAC[J-1:0] provided by column address counter 382 into local address ADDR (as described with respect to FIG. 3A). Address decoder 389 can comprise any circuit for decoding counter value CAC[J-1:0] into an appropriate local address ADDR.

For example, according to an embodiment of the invention, address decoder 389 can comprise a word decoder 383 and a column decoder 384. When decode enable signal DCEN is asserted, word decoder 383 decodes the first half of counter value CAC[J-1:0] (i.e., CAC[J-1:N]) into a Q-bit word selection signal W[Q-1:0], while column decoder 384 decodes the remaining half of counter value CAC[J-1:0] (i.e., CAC[N-1:0]) into a Q-bit column selection signal C[Q-1:0].

Word selection signal W[Q-1:0] can comprise a quantity "Q" of individual word selection bits (i.e., W<0>through W<Q-1>), wherein only the bit representing the value of counter value portion CAC[J-1:N] is asserted. For example, if counter value portion CAC[J-1:N] has a zero value (i.e., CAC<0 . . . 00>), then the bits of word selection signal W[Q-1:0] will all be zero except for the least significant bit (LSB) (i.e., W<0 . . . 01>). Then, when counter value portion CAC[J-1:N] increments to a value of one, the bits of word selection signal W[Q-1:0] will all be zero except for the second LSB (i.e., W<0 . . . 10>). Similarly, Q-bit column selection signal C[Q-1:0] comprises a quantity "Q" individual column selection bits (i.e., C<0>through C<Q-1>), with only the bit representing the value of counter value portion CAC[N-1:0] being asserted. In this manner, word selection signal W[Q-1:0] and column selection signal C[Q-1:0] can form local address ADDR as described with respect to FIG. 3A.

Once the bitstream portion has been loaded into the appropriate region of the bitstream latch (as determined by address ADDR or redundancy enable signal R_EN), counter controller 381 asserts a counter enable signal COUNTEREN. Counter enable signal COUNTEREN causes column address counter to increment counter value CAC[J-1:0], which redundancy circuit 385 then uses to determine whether or not to assert match signal HIT (i.e., whether or not the new bitstream portion needs to be loaded into the redundant columns). In this manner, shift control circuit 361 monitors the programming bitstream to prevent programming into defective columns.

Figure 3C:
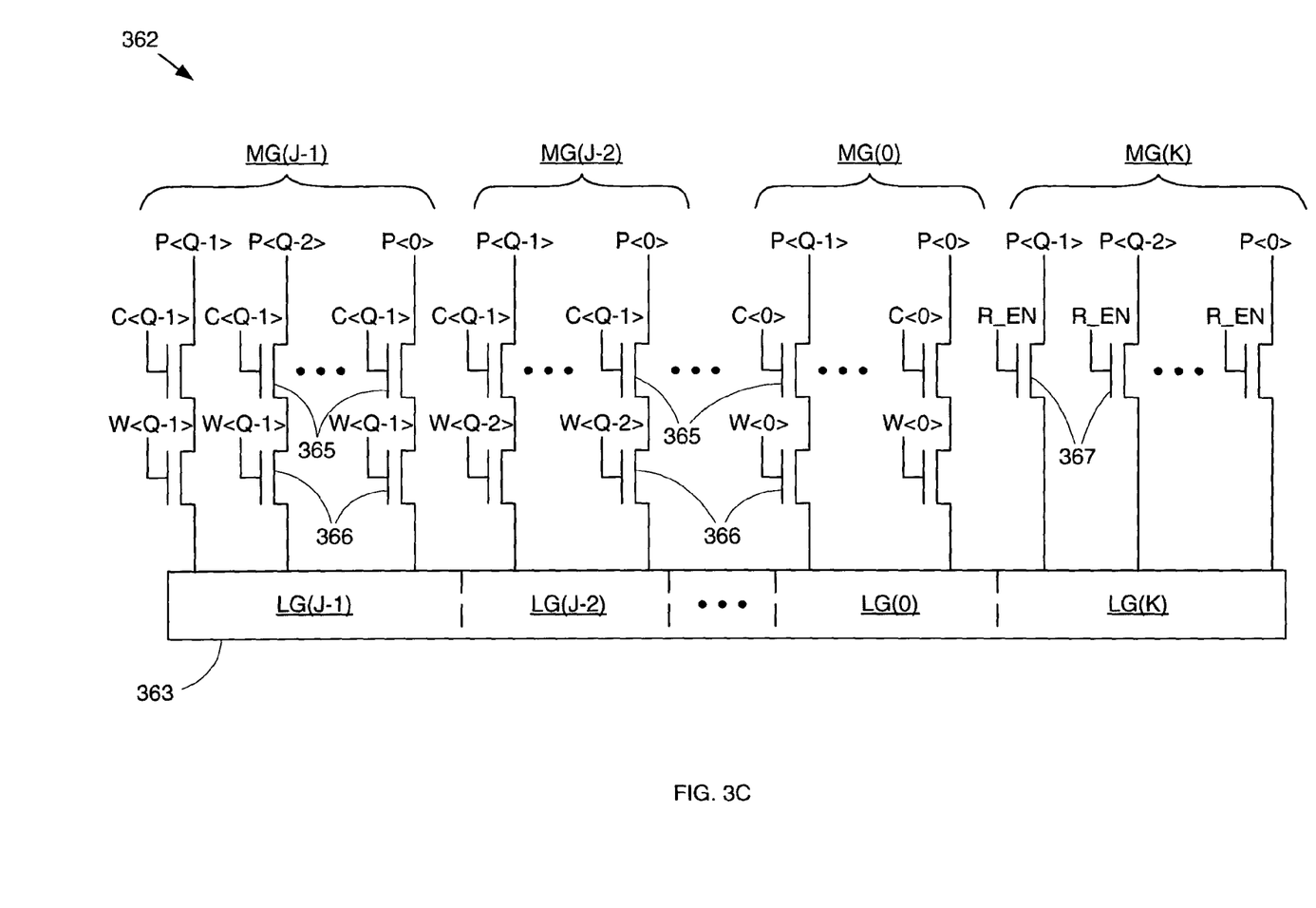
FIG. 3C is a schematic diagram of a column multiplexer for the serially programmable IC of FIG. 3A, according to an embodiment of the invention.

FIG. 3C shows a schematic diagram of column multiplexer 362 in accordance with an embodiment of the invention. Column multiplexer 362 includes a plurality of pass transistor groupings MG(0)–MG(J-1) and MG(K). Each of pass transistors groupings MG(0)–MG(J-1) is associated with one of latch groupings LG(0)–LG(J-1), respectively, and includes an NMOS transistor 365 and an NMOS transistor 366 connected serially between each bit of bitstream portion P[Q-1:0] and a corresponding latch (not shown) in the bitline latch region.

The gate of each transistor 365 and 366 in a particular pass transistor grouping is coupled to receive one of the bits of column selection signal C[Q-1:0] and word selection signal W[Q-1:0] (described with respect to FIG. 3B), respectively. For example, the gates of transistors 365 and 366 in pass transistor grouping MG(J-1) are coupled to receive the most significant bits (MSBs) of column selection signal C[Q-1:0] and word selection signal W[Q-1:0], respectively (i.e., C[Q-1] and W[Q-1], respectively).

While the gates of transistors 365 in pass transistor grouping MG(J-2) are also coupled to receive C[Q-1], the gates of transistors 366 in pass transistor grouping MG(J-2) are coupled to receive a different bit from word selection signal W[Q-1:0] (i.e., W[Q-2]). Each of pass transistor groupings MG(0)–MG(J-1) receives a different combination of bits from column selection signal C[Q-1:0] and word selection signal W[Q-1:0], so that any given values of column selection signal C[Q-1:0] and word selection signal W[Q-1:0] will turn on both transistors 365 and 366 in only one of pass transistor groupings MG(0)–MG(J-1), ensuring that each bitstream portion will be loaded into a different bitline latch region.

Pass transistor grouping MG(K) includes a single NMOS transistor 367 connected between each bit of bitline portion P[Q-1:0] and a corresponding latch (not shown) in bitline latch region LG(K). The gates of each of transistors 367 are coupled to receive redundancy enable signal R_EN from redundancy circuit 385 (described in FIG. 3B). Therefore, when redundancy circuit 385 detects a defective column grouping address and asserts redundancy enable signal R_EN, pass transistor grouping MG(K) of column multiplexer 362 loads bitline portion P[Q-1:0] into bitline latch region LG(K) (i.e., the region of bitline latch 363 associated with the redundant columns of the memory array). In this manner, column multiplexer 362 properly distributes the various bitstream portions among bitstream latch regions LG(0)–LG(J-1) and LG(K).

Figure 4:
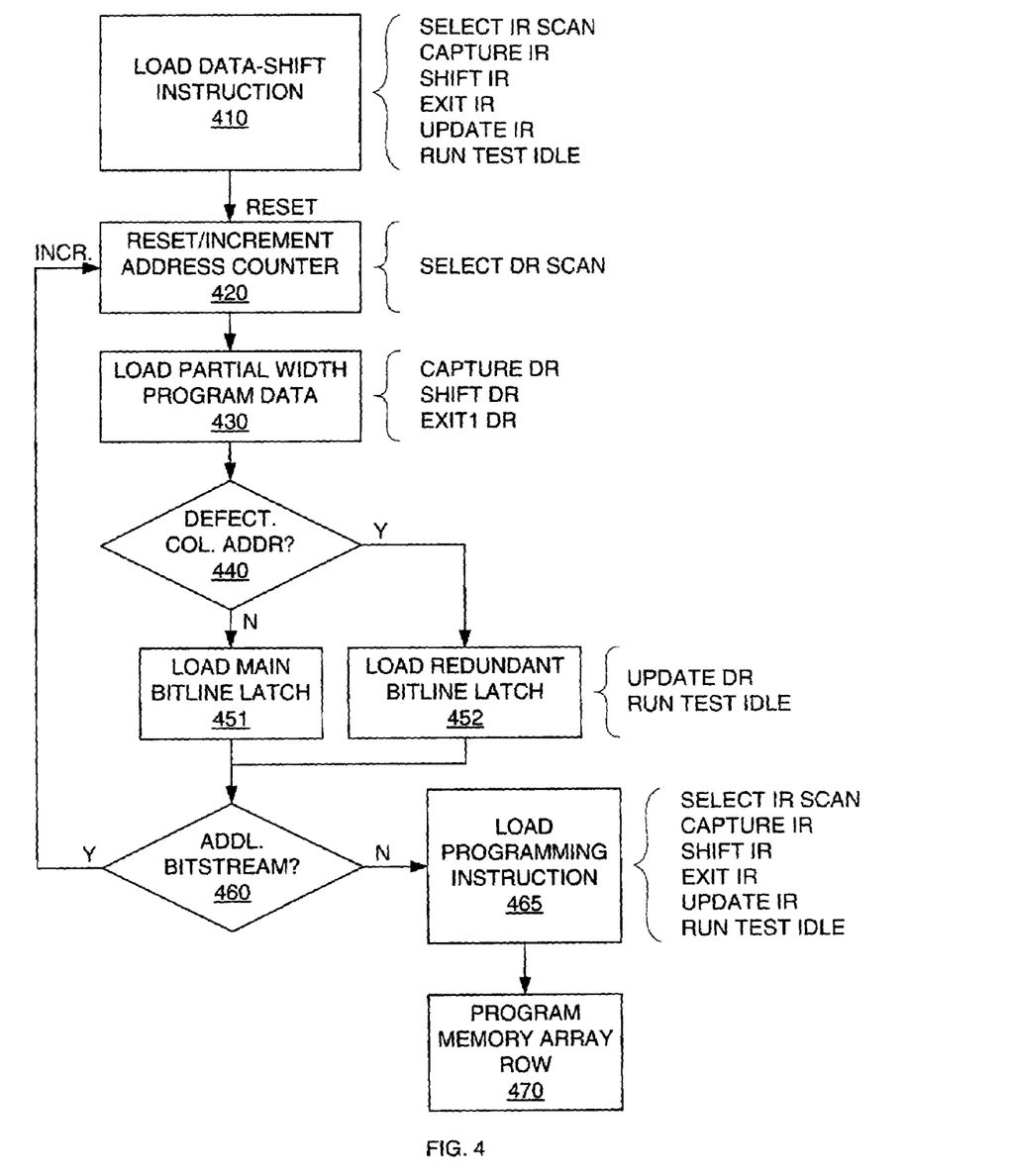
FIG. 4 is a flow diagram of a segmented serial programming methodology using a JTAG interface, in accordance with an embodiment of the invention.

FIG. 4 shows a flow diagram for the segmented programming operation described with respect to FIGS. 3A–3C, according to an embodiment of the invention. Note that the standard TAP controller states in the associated IR path are listed next to step 410 and the standard TAP controller states in the associated DR path are listed next to steps 420, 430, 451, 452, and 465, described below, for reference purposes. As noted above, the details of the various TAP controller states are described in section 5 of IEEE standard 1149.1.

Thus, in a "LOAD DATA-SHIFT INSTRUCTION" step 410, the instruction to shift segmented data into the devices is shifted into instruction register 330, as TAP controller 302 switches through states SELECT-IR-SCAN, CAPTURE-IR, SHIFT-IR, EXIT-IR, UPDATE-IR, and ends in state RUN-TEST-IDLE. Next, TAP controller 302 transitions to a SELECT-DR-SCAN state to enter the DR path in a "RESET/INCREMENT ADDRESS COUNTER" step 420, and counter value CAC[J−1:0] in column address counter 382 is reset to a predetermined initial value to begin the programming operation. Then, in a "LOAD PARTIAL WIDTH PROGRAM DATA" step 430, a portion of the programming bitstream is shifted into data register 341. During step 430, TAP controller 302 first shifts into a CAPTURE-DR state, but since serial data is being shifted into the data register, it then transitions into a SHIFT-DR state, which allows the bitstream data to be shifted into data register 341. Once data register 341 is filled with new data, TAP controller 302 transitions into an EXIT1-DR state to end the process.

Next, redundancy circuit 385 determines whether or not the counter value provided by column address counter 382 corresponds to a defective column grouping in a "DEFECTIVE COLUMN ADDRESS?" step 440. If so, then the bitstream portion is loaded into a region of bitline latch 363 associated with the redundant columns in a "LOAD REDUNDANT BITLINE LATCH" step 452. However, if a defective column grouping address is not detected, the bitstream portion is loaded into a non-redundant region of bitline latch 363 in a "LOAD MAIN BITLINE LATCH" step 451. In either case, the actual loading of the data from data register 341 into bitline latch 363 involves switching TAP controller 302 into an UPDATE-DR state to enable the loading operation and then switching into the RUN-TEST-IDLE state to complete the process.

An "ADDITIONAL BITSTREAM?" step 460 determines whether or not the entire programming bitstream has been loaded into bitline latch 363, and if additional portions of the programming bitstream remain to be loaded, the process loops back to step 420 so that column address counter 382 increments counter value CAC[J−1:0]. The next bitstream portion is evaluated and loaded into the appropriate bitline latch region following steps 430, 440, 451, and 452. Once the programming bitstream has been fully loaded, an instruction is loaded into the instruction register in a continuous bitstream in a "LOAD PROGRAMMING INSTRUCTION" step 465. This initiates a "PROGRAM MEMORY ARRAY ROW" step 470, during which the data stored in bitline latch 363 is programmed into a selected row of memory array 320.

Figure 5A:
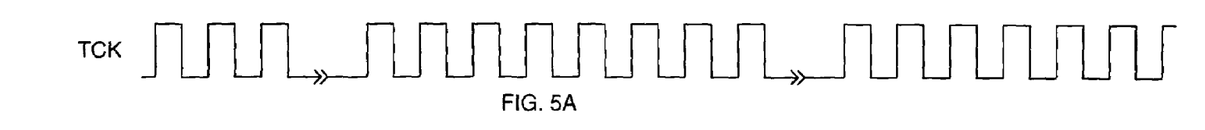
FIGS. 5A, 5B, 5C, 5D, 5E, 5F and 5G are sample timing diagrams for various signals shown in FIGS. 3A–3C during the programming methodology shown in FIG. 4, according to an embodiment of the invention.
Figure 5B:
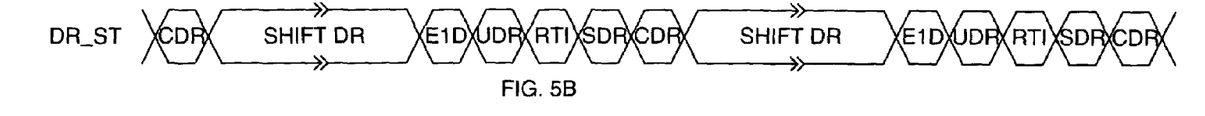
Figure 5C:
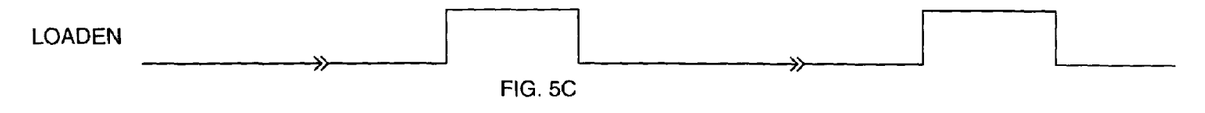
Figure 5D:
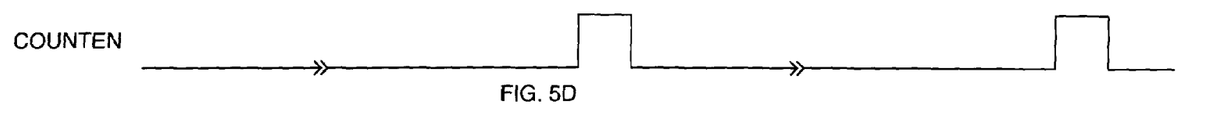

FIGS. 5A, 5B, 5C, 5D, 5E, 5F and 5G are sample timing diagrams for test clock TCK, TAP controller DR chain state DR_ST, load enable signal LOADEN, counter enable signal COUNTEREN, count value CAC[J−1:0], HIT signal, and R_EN signal respectively, as described with respect to FIGS. 3A–3C. As indicated in FIG. 5B, TAP controller spends multiple clock cycles in the SHIFT-DR state, during which time bitstream data is being shifted into data register 341. Once the data register is full, TAP controller 302 enters the EXIT1-DR (E1D) state, and load enable signal LOADEN is asserted so that the bitstream portion in the data register can be latched into bitline latch 363 when the TAP controller transitions into the UPDATE-DR (UDR) state.

Figure 5E:
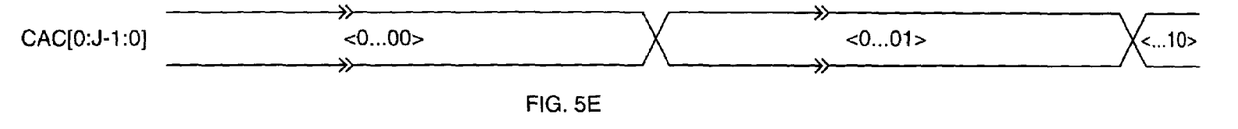

When the TAP controller subsequently switches into the SELECT-DR-SCAN (SDR) state, load enable signal LOADEN is deasserted to prevent further changes to the bitline latch data, and counter enable signal COUNTEREN is asserted to increment count value CAC[J−1:0] (as shown in FIG. 5E). The TAP controller then transitions into a CAPTURE-DR (CDR) state and counter enable signal COUNTEREN is deasserted to prevent further incrementing of count value CAC[J−1:0].

Figure 5F:
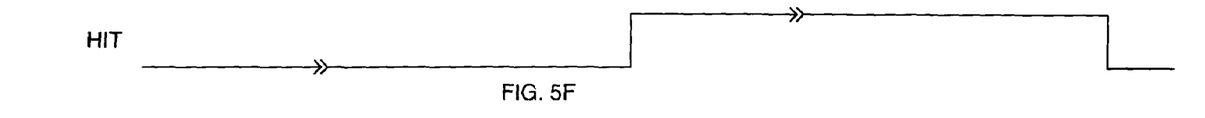
Figure 5G:
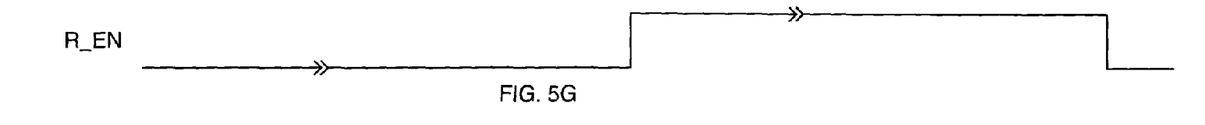

When TAP controller switches into a SHIFT-DR state again, the next bitstream portion is shifted into the data register. If column address <0 . . . 01> is defective, and is stored into redundancy circuit 385 (as described in FIG. 3B), match signal HIT and redundancy enable signal R_EN are asserted when count value CAC[J−1:0] is incremented from <0 . . . 00> to <0 . . . 01>, as indicated in FIGS. 5F and 5G, respectively. In this manner, the standard JTAG states are used to perform the segmented programming operation.

The various embodiments of the structures and methods of this invention that are described above are illustrative only of the principles of this invention and are not intended to limit the scope of the invention to the particular embodiments described. For example, while address decoder 389 in FIG. 3B is depicted as having two subdecode units (i.e., word decoder 383 and column decoder 384) for exemplary purposes, address decoder 389 may comprise any number of subdecode units. Column multiplexer 362 shown in FIG. 3C may then include a corresponding number of pass transistors for each latch in bitline latch 363. Alternatively, address decoder 389 may simply comprise a lookup table (LUT) that would store local addresses ADDR based on particular count values CAC[J−1:0]. Then, depending on the format of the local addresses ADDR, column multiplexer 362 may include just a single pass transistor for each latch in bitline latch 363. Thus, the invention is limited only by the following claims and their embodiments.

What is claimed is:

1. A serially-programmable integrated circuit (IC) comprising:
    a first input connector for receiving serial programming data;
    a memory array having a first width, the memory array comprising a plurality of primary columns and a plurality of redundant columns, the plurality of primary columns having a second width and the plurality of redundant columns having a third width;
    a data register coupled to receive the serial programming data from the first input connector, the data register comprising a shift register having a fourth width, the fourth width being a divisor of the second width and the third width;
    a bitline latch for loading a data word into the memory array, the bitline latch having the first width; and
    a column multiplexer for performing a loading operation to load data in parallel from the data register into the bitline latch.

2. The serially-programmable IC of claim 1, wherein the memory array is organized into a plurality of column groupings, each of the column groupings having the fourth width, and wherein the bitline latch is organized into a plurality of latch groupings, each of the latch groupings having the fourth width, each of the plurality of latch groupings being associated with one of the plurality of column groupings.

3. The serially-programmable IC of claim 2, further comprising a shift control circuit for providing an address signal to the column multiplexer, the address signal instructing the column multiplexer to load data from the data register into a selected one of the plurality of latch groupings.

4. The serially-programmable IC of claim 3, wherein the shift control circuit comprises:

a counter circuit for generating a count value, wherein the shift control circuit increments the counter circuit each time the column multiplexer performs the loading operation; and an address decoder for generating the address signal from the count value.

5. The serially-programmable IC of claim 4, wherein the plurality of latch groupings includes a plurality of primary latch groupings associated with the plurality of primary columns and a redundant latch grouping associated with the plurality of redundant columns, wherein the shift control circuit further comprises a redundancy circuit for comparing the count value to a predetermined count value, the predetermined count value corresponding to a first one of the plurality of primary latch groupings, the first one of the plurality of latch groupings being associated with a first one of the plurality of column groupings, the first one of the plurality of column groupings including a memory defect, wherein when the count value matches the predetermined count value, the redundancy circuit asserts a redundancy enable signal instructing the column multiplexer to load data from the data register into the redundant latch grouping.

6. The serially-programmable IC of claim 5, wherein the redundancy circuit comprises a content addressable memory (CAM) for storing the predetermined count value.

7. The serially-programmable IC of claim 5, wherein when the plurality of redundant columns are in use, the redundancy circuit asserts a redundant-column-on signal, the redundant-column-on signal enabling the redundancy enable signal.

8. The serially-programmable IC of claim 7, wherein the address signal comprises a plurality of word indicator bits and a plurality of column indicator bits, and wherein the address decoder comprises:

a word decoder for decoding a first portion of the count value into the plurality of word indicator bits; and a column decoder for decoding a second portion of the count value into the plurality of column indicator bits.

9. The serially-programmable IC of claim 8, wherein the data register comprises a plurality of flip flops, wherein each of the plurality of latch groupings comprises a plurality of latches, and wherein the column multiplexer comprises:

a first plurality of pass transistor groupings, each of the first plurality of pass transistor groupings comprising a plurality of pass transistor sets, each of the pass transistor sets being coupled between one of the plurality of flip flops and one of the plurality of latches in one of the plurality of primary latch groupings, each of the plurality of pass transistor sets in each of the first plurality of pass transistor groupings comprising a first transistor and a second transistor coupled in series, with the gate of the first pass transistor being coupled to receive one of the plurality of column indicator bits and the gate of the second pass transistor being coupled to receive one of the plurality of word indicator bits; and a redundant pass transistor grouping comprising a plurality of individual pass transistors, each of the individual pass transistors being coupled between one of the plurality of flip flops and one of the plurality of latches in the redundant latch grouping, the gates of each of the individual pass transistors being coupled to receive the redundancy enable signal.

10. The serially-programmable IC of claim 4, wherein the serially-programmable IC comprises a Joint Test Action Group (JTAG) programmable IC, and wherein the first input connector comprises a test data input (TDI) terminal.

11. The serially-programmable IC of claim 10, further comprising:

an instruction register coupled to receive an instruction bitstream via the TDI terminal;

an instruction decoder for decoding the instruction bitstream stored in the instruction register to generate an instruction signal; and a test access port (TAP) controller for providing JTAG states in response to a test mode select (TMS) signal and a test clock (TCK) signal, wherein the shift control circuit further comprises a counter controller coupled to the TAP controller, wherein when the instruction signal is equal to a specified data loading instruction, the counter circuit generates a counter enable signal in response to a JTAG SHIFT-DR state from the TAP controller, the counter enable signal incrementing the counter circuit.

12. The serially-programmable IC of claim 1, wherein the serially-programmable IC comprises an electrically erasable programmable read only memory (EEPROM).

13. The serially-programmable IC of claim 1, wherein the serially-programmable IC comprises a FLASH memory.

14. An integrated circuit (IC) comprising:

a Test Access Port (TAP) port including a test data input (TDI) terminal;

a memory array having a first width, the memory array including a plurality of primary columns and a plurality of redundant columns;

a data register coupled to the TDI terminal, the data register having a second width, the second width being less than the first width; and a bitline latch coupled between the data register and the memory array, the bitline latch having the first width.

15. The IC of claim 14, further comprising means for loading a programming bitstream into the bitline latch by shifting successive portions of the programming bitstream into the data register and then loading each of the successive portions of the programming bitstream from the data register into the bitline latch.

16. The IC of claim 15, wherein the memory array is organized into a plurality of primary column groupings and at least one redundant column grouping, each of the plurality of primary column groupings having a primary column grouping width equal to the second width, and the at least one redundant column grouping having a redundant column grouping width equal to the second width, wherein the IC further comprises means for assigning a position indicator to each of the successive portions of the programming bitstream, each position indicator being associated with one of the plurality of primary column groupings.

17. The IC of claim 16, wherein the means for assigning the position indicator comprises a counter circuit for incrementing a counter value for each of the successive portions of the programming bitstream shifted into the data register, the counter value providing the position indicator.

18. The IC of claim 17, wherein the bitline latch is organized into a plurality of latch groupings, each of the plurality of latch groupings having a latch grouping width equal to the second width and each of the plurality of latch groupings being associated with one of the plurality of primary column groupings or the at least one redundant column grouping, the IC further comprising means for comparing the position indicator for the portion of the programming bitstream in the data register with a defective column position indicator;

means for loading the portion of the programming bitstream in the data register into the latch grouping associated with the primary column grouping associated with the position indicator assigned to the programming bitstream in the data register when the position indicator assigned to the portion of the programming bitstream in the data register does not match the defective column position indicator; and means for loading the portion of the programming bitstream in the data register into the at least one redundant column grouping when the position indicator assigned to the portion of the programming bitstream in the data register matches the defective column position indicator.

19. The IC of claim 18, wherein the means for comparing the position indicator comprises a content addressable memory (CAM) for storing the defective column position indicator.

20. The IC of claim 19, wherein the CAM asserts a match signal when the position indicator assigned to the portion of the programming bitstream in the data register matches the defective column position indicator, and wherein the means for loading the portion of the programming bitstream in the data register into the at least one redundant column grouping comprises a column multiplexer, the column multiplexer loading the portion of the programming bitstream in the data register into the latch grouping associated with the at least one redundant column grouping in response to the match signal.

21. The IC of claim 20, wherein the means for loading the portion of the programming bitstream in the data register into the latch grouping associated with the primary column grouping associated with the position indicator comprises an address decoder for decoding the position indicator into a local address when the match signal is not asserted, the local address instructing the column multiplexer to load the portion of the programming bitstream in the data register into the latch grouping associated with the primary column grouping associated with the position indicator.

* * * * *